United States Patent [19]
Bassetti et al.

[11] Patent Number: 5,757,338
[45] Date of Patent: May 26, 1998

[54] EMI REDUCTION FOR A FLAT-PANEL DISPLAY CONTROLLER USING HORIZONTAL-LINE BASED SPREAD SPECTRUM

[75] Inventors: Chester F. Bassetti, Pleasanton; Mangesh S. Pimpalkhare, Santa Clara; Krishnan C. Dharmarajan, Fremont, all of Calif.

[73] Assignee: NeoMagic Corp., Santa Clara, Calif.

[21] Appl. No.: 701,814

[22] Filed: Aug. 21, 1996

[51] Int. Cl.$^6$ .................................................. G09G 5/00
[52] U.S. Cl. ..................... 345/3; 345/507; 345/204; 315/85; 348/819
[58] Field of Search ........................... 348/819, 805, 348/806, 820, 511, 540; 345/1, 3, 132, 507, 212, 196, 213, 204, 905; 315/85, 10; 364/708.1; 361/680, 681, 683

[56] References Cited

U.S. PATENT DOCUMENTS

| | | | |
|---|---|---|---|
| 4,497,036 | 1/1985 | Dunn | 364/708.1 |
| 4,926,166 | 5/1990 | Fujisawa et al. | 345/3 |
| 5,107,188 | 4/1992 | Rendal | 315/370 |
| 5,157,308 | 10/1992 | Rirdal | 315/85 |
| 5,309,168 | 5/1994 | Itoh et al. | 345/3 |
| 5,381,043 | 1/1995 | Kohiyana et al. | 364/708.1 |
| 5,408,500 | 4/1995 | Ginzburg et al. | 375/288 |
| 5,479,183 | 12/1995 | Fulimoto | 345/3 |
| 5,479,184 | 12/1995 | Tokumitsu | 345/3 |
| 5,506,545 | 4/1996 | Andrea | 331/78 |
| 5,508,714 | 4/1996 | Zenda | 345/3 |
| 5,541,646 | 7/1996 | Huang | 348/511 |
| 5,610,955 | 3/1997 | Bland | 375/376 |
| 5,631,920 | 5/1997 | Hardin | 375/200 |
| 5,659,339 | 8/1997 | Rirdal et al. | 345/212 |

OTHER PUBLICATIONS

IMISM530 Reduced EMI Clock Modulator Chip Datasheet, International Microcircuits, Inc., Apr. 1995, pp. 1–7.

*Primary Examiner*—Lun-Yi Lao
*Attorney, Agent, or Firm*—Stuart T. Auvinen

[57] ABSTRACT

A graphics controller uses spread-spectrum techniques to modulate the pixel clock over a range of frequencies, reducing the maximum intensity of EMI emissions. When the clock input to the graphics controller is replaced with a modulated clock, the image on a CRT is distorted. Distortion is avoided by only modulating the clock to the flat-panel LCD interface. The vertical and horizontal timing signals for both the CRT and the LCD are generated from the un-modulated clock. Using the un-modulated clock for these critical timing signals ensures that each horizontal line is displayed for the same period of time. Brighter and dimmer lines are thus avoided. A second embodiment modulates the clocks to the CRT and LCD, reducing emissions for both interfaces. Even the timing signals use the modulated clock. The frequency sweep of the modulated clock is reset at the end of every horizontal line. Thus all lines are displayed for the same period, although the transfer of pixels within a line are modulated. Even though the pixel clock is modulated while pixels are written to the displays, the same sequence of modulations is repeated for each line. Thus pixels from different lines are aligned and zig-zag and wiggle distortions seen when simple asynchronous modulation is applied to all clocks is avoided.

7 Claims, 9 Drawing Sheets

ALL LINES
40 MHz PIXEL
CLOCK

MODULATED
38-42 MHz
PIXEL CLOCK

EMI REDUCTION FOR A FLAT-PANEL DISPLAY CONTROLLER USING HORIZONTAL-LINE BASED SPREAD SPECTRUM

BACKGROUND OF THE INVENTION

Field of the Invention

This invention relates to reduction of electromagnetic interference (EMI) from computer equipment, and more particularly for methods to reduce EMI from a graphics subsystem.

BACKGROUND OF THE INVENTION

Description of the Related Art

Electronic equipment can often generate interference which creates disturbances in other electronic equipment. For example, a portable computer may emit radiation which interferes with a television receiver. Intentional receivers, such as televisions, cellular phones, pagers, and wireless devices, are often affected by unintentional transmitters which emit electromagnetic radiation. As both types of electronic equipment become more common, interference becomes more noticeable to the consumer.

Electromagnetic interference (EMI) is a measure of the amount of interference that an electronic device (the unintentional transmitter) disturbs an intentional receiver. Government agencies such as the Federal Communication Commission (FCC) strictly regulate the amount of radiation or EMI that an electronic device can generate.

Portable devices such as portable personal computers (PC's) are particularly problematic since these portable devices are easily placed near televisions or other receivers. Cramped office and living spaces often force electronic equipment closer together. Since radiation rapidly decreases with distance, smaller and more portable equipment often appear to generate more interference.

Improving technology also worsens the EMI problem. Faster clock rates of higher-speed PC's generate more radiation. Higher resolution monitors and displays require that more pixels be transferred to the screen for each screen refresh period; thus a higher clock rate and more interference results.

Flat-Panel Interface Generates More EMI Than CRT Interface

Traditional cathode-ray-tube (CRT) monitors are connected to PC's by shielded cables to control EMI. CRT's are driven by relatively low analog voltages which farther minimize EMI. Thus although the long cable acts as a good antenna, the shielding and low voltages greatly reduce EMI.

Portable computers typically contain a flat-panel display using technologies such as LCD (liquid-crystal-display) or TFT (thin film transistor). A graphics controller is normally located under the keyboard and is connected to the display through one or more hinges. These hinges are limited in size and thus shielding the cable between the graphics controller and the display is not practical. The flat-panel display is close to the graphics controller, so EMI is reduced since the parasitic antenna length is small. However, the interface between the graphics controller and the display is usually all digital, using 5-volt TTL signals. A large number of signals is required for the interface, perhaps 8 to 36 signals for the pixel data itself. Thus the flat-panel display's interface generates more interference that the CRT interface.

Traditional techniques to reduce EMI attempt to contain radiation or to reduce the amount of radiation generated. Coax wires and shielded cables are effective at containing radiation, but are expensive, heavy, bulky, and inflexible. The weight and bulk of shielded cables make them undesirable for portable computers. The bulk and relative inflexibility of shielded cables makes it difficult to thread them through the clam-shell hinges connecting the graphics controller in the keyboard-containing base unit with the flat-panel display. Metal chassis with sealed seams are effective for reducing EMI of desktop PC's, but portable PC's are kept light by using plastic. Toxic metal paints are sometimes sprayed on plastic housings for portable PC's to provide shielding.

Lower voltages reduce the intensity of the radiation generated, and the new 3-volt standard has helped reduce EMI at all harmonics. Proper impedance matching and termination of signals reduces ringing and harmonics, and shorter signal traces further reduce radiation. Ground planes on PCB's or ground lines running parallel with signal lines effectively shield signals on boards. Filtering can reduce sharp rise and fall times and reduce radiation by wave shaping since more sinusoidal waves have fewer harmonics than square waves. Of course, filters require additional capacitors, resistors, or inductors, raising the cost. All of these techniques are useful to varying extents.

Frequency Modulation—Spread Spectrum

A newer technique to reduce EMI is to vary or modulate the frequency of clocks in the PC. This technique known as spread spectrum, since the frequency spectrum of the clock is spread out over a wider range of frequencies. FIG. 1 shows a graph of radiation intensity as a function of frequency for an un-modulated clock signal. A sharp spike occurs at a harmonic of the clock's frequency, 40 MHz. Since the clock constantly operates at the rated frequency, all of the energy of the radiation appears in a narrow spike, which has a large amplitude. The spike has an amplitude over the EMI limit set by the FCC. The high intensity of the spike can cause interference in a receiver.

FIG. 2 is a graph of radiation intensity as a function of frequency generated by a modulated clock. The clock's frequency is not constant, but is varied with time over a range of +5% to −5% of the rated frequency. Thus the clock operates at 40 MHz for a period of time, but also operates at other frequencies between 38 MHz and at 42 MHz at other times. Such a clock can be generated by slowly changing the frequency from 38 MHz to 42 MHz and then slowly reducing the frequency back to 38 MHz. A voltage-controlled oscillator (VCO) can be used with the input voltage being slewed back and forth between voltages which generate 38 MHz and 42 MHz oscillations.

Since the modulated clock spends only part of the time at 40 MHz, the intensity of the radiation, averaged over a relatively long time, is reduced. The total energy of the radiation at all frequencies is about the same as for the un-modulated clock of FIG. 1, but the intensity at any particular frequency is greatly reduced. Interference at any one frequency is reduced since receivers generally are tuned to a particular frequency (even FM receivers are tuned to a relatively small range of frequencies).

Thus modulating the clock's frequency reduces the maximum intensity of radiation at any one frequency, although the energy radiated at all frequencies is not reduced. This has the practical effect of reducing interference for receivers tuned to a fixed frequency.

The clock's frequency must not change too rapidly. Rapid variations in frequency can upset phase-locked loops (PLLs) driven by the modulated clock. These PLLs can lose the phase lock and produce erratic outputs. Thus the frequency is modulated slowly. The clock's frequency must not change too slowly, to avoid losing the benefit of EMI reduction.

Graphics controllers in particular have many clocks derived from the input graphics clock. For instance, for SVGA resolution mode a basic clock is multiplied and divided to generate a 40 MHz pixel clock, a 37 KHz HSYNC clock, and a 60 Hz VSYNC clock, and perhaps a 5 MHz character clock. Different resolutions can require that the clock multiplier and divisors be changed to produce signals with the desired timing for that selected resolution.

Phase-locked loops (PLL's) generate a clock by comparing the phase of an input clock to the phase of a generated clock, which is fed back to the phase comparator. The output of the phase comparator is filtered and then input to a voltage-controlled oscillator (VCO). The VCO varies the frequency of the generated clock as the filtered voltage from the phase comparator varies.

The frequency of the generated clock from the VCO does not have to be the same as the frequency of the input clock. The input clock can be divided by a counter to reduce the frequency of the generated clock (clock divisor), while the generated clock fed back to the phase comparator can be divided to increase the frequency of the generated clock (clock multiplier). Since the resolutions are programmable and can be changed by older user application programs, the clock multipliers and divisors are often changed to new values.

These changeable divisors and multipliers can delay phase comparison by many clock periods, resulting in added delays until a modulation in the clock frequency is responded to. For example, a divisor or multiplier of 16 causes the phase comparison to be delayed up to 16 clock periods. The output frequency of the PLL can drift between these delayed phase comparisons, resulting in more jitter.

Typically the loop filter values in these PLL's are made large to provide low jitter with a stable reference clock. When this reference clock is purposely modulated, the PLL is no longer operating with a stable reference as it was designed for. This can upset the PLL and introduce more jitter than anticipated.

Long Sweep Period of Modulation—FIG. 3

FIG. 3 is a graph of a modulated clock's frequency as a function of time over a few sweep periods. The clock's nominal frequency is 40 MHz. The clock is modulated by +/−5%, from 38 MHz to 42 MHz. The clock's frequency is swept from minimum to maximum frequencies over one or two thousand clock periods so that adjacent clock pulses have a very small variation. A 40 MHz clock with a 25 nanosecond (ns) period is varied from 26.25 ns to 24.75 ns over a sweep period, a variation of +/−1.25 ns. A 37 KHz sweep rate has a sweep period of 27 micro-seconds (μs). A sweep period is 27 μs/25 ns or 1081 clock periods. The cycle-to-cycle period variation for two adjacent clock periods is thus 1.25 ns/1081 or 1.15 pico-seconds (ps). This small cycle-to-cycle variation is needed to prevent PLL's from losing their phase lock. The sweep period is typically 15 to 30 KHz.

CRT Display Scans Horizontal Lines of Pixels at HSYNC Rate

FIG. 4 is a diagram of a display, which could be a cathode-ray-tube (CRT) video display, or a flat-panel liquid-crystal display (LCD) or other type of display. An image is formed on the display screen by selectively energizing or illuminating small dots or pixels on the screen. In a CRT, a pixel is energized by an electron gun that directs a beam of energizing electrons to a particular point on the screen. The electron beam is scanned from left to right in a horizontal line and pulsed to illuminate some points on the line but not others. The screen is divided into a number of horizontal lines 10, 12, 16, with each line comprising a number of pixels. The pixels in a line are illuminated one-by-one from the left side to the right side of a horizontal lines 10, 12, 16.

Once the entire horizontal line 10, 12, 16 has been scanned, the electron beam is disabled or "blanked" so that no pixels are energized and the electron beam is re-traced back to the beginning on the next horizontal line 12. This horizontal re-trace 14 follows a diagonal path. After re-trace, the blanking is ended and the next horizontal line 12 is scanned. The process of scanning a horizontal line and re-tracing is repeated until all lines are scanned. Once scanning of the last horizontal line 16 is complete, the electron beam is returned to the beginning of the first line 10 by a vertical re-trace 18. The electron beam is again blanked to prevent any illumination while the electron beam is being retraced to the top of the screen.

Pixels not in a Fixed Location on Screen

One characteristic of a CRT is that the pixels are created on the screen at a location that is not fixed. The location of a certain pixel on the screen is determined by the timing of the lines and pixels being written to the screen. The distance of a pixel from the left of the visible screen, the first pixel at the beginning of the line, is determined by the number of pixels written so far to the horizontal line. Ordinarily the eight-hundredth pixel of each horizontal line appears at about the same distance from the left of the screen. This distance is determined by the number of pixels written in the line, multiplied by the width of each pixel. The width of the pixel is determined by the period of the pixel clock which times the writing of the pixel to the display.

When the pixel clock is not constant, but modulated, then some pixels appear wider than others. A pixel written when the pixel clock is at 38 MHz appears about 10% wider than a pixel written when the pixel clock is 42 MHz. While this difference in pixel width is not noticeable for an individual pixel, the different pixel widths are accumulated over hundreds of pixels until pixels near the middle or end of the horizontal line are visibly displaced.

Visible differences are especially noticeable when one horizontal line is written with a higher pixel-clock rate than an adjacent line. FIG. 5 shows a display using a modulated clock where different lines have pixels displaced relative to pixels in other lines. Horizontal line 11 is written with a 42 MHz pixel clock, while line 13 is written with a 40 MHz pixel clock and line 15 with a 38 MHz pixel clock. While the difference in the width of any individual pixel is slight, when accumulated over 100 pixels, the difference is apparent. The displacement of the one-hundredth pixel of line 11 relative to line 15 is 100×10% or 10 pixels. This is a large, easily noticeable displacement.

As more pixels for a horizontal line are written, the frequency of the pixel clock is swept. Thus line 11 has the first pixel written with the pixel clock at 42 MHz, but later pixels are written with the pixel clock closer to 40 MHz or 38 MHz, depending on the sweep rate and the horizontal line rate. Thus the differences between lines can be lessened as more pixels on the line are written, so that by the time the last pixel is written, the displacement is smaller. However, some pixels at the end of the line may not be displayed if the horizontal blanking signal turns on early and the last pixel is written too late. Thus some of the pixels at the right edge of the display may be lost.

Sweep Period and Horizontal Sync Period of CRT

FIG. 5 is an idealized case where each line begins at a particular frequency. In reality, each line begins at a frequency which is determined by the sweep rate and the horizontal line rate. This sweep rate, about 30 KHz, is on the order of the horizontal sync rate for many CRT monitors, which typically have HSYNC rates of 30 to 50 KHz.

Other problems using a modulated clock with a graphics subsystem occur when internal PLL's in the graphics controller have a loop delay which is long relative to the change in frequency due to clock modulation. The large loop delay may cause the PLL to not be able to keep track with the modulation sweep, causing erratic behavior.

Image Distortions When Graphics Clock is Modulated—FIG. 6

FIG. 6 shows a portable PC driving a flat panel and a CRT when the graphics clock is modulated. Laptop PC 20 has a flat-panel LCD display 22 built into the portable PC, and a separate CRT which can simultaneously display the same image which is displayed on LCD display 22.

When the graphics clock is modulated with a sweep rate of about 15 to 30 KHz, the standard setting for a commercial clock modulation product, the image is displayed properly on LCD display 22, but the same image on CRT 24 is noticeably distorted. Vertical lines are not straight, although horizontal lines appear correctly. The image on CRT 24 appears to zig-zag and wiggle, since pixels in one horizontal line are displaced relative to pixels in other adjacent horizontal lines. This displacement is caused by different clock frequencies being used when different lines are written.

Since the frequency of the modulated clock is constantly changing, and is not an exact multiple of the horizontal line rate, each time the screen is re-drawn, the pixels on any line move relative to their last position. The PLL's also introduce random jitter, as they are unable to keep up with introduced modulations when the reference clock is divided and phase comparisons are delayed. Thus the wiggle appears to change as each new screen refresh occurs, and the image jumps around. Text is broken and fuzzy and nearly impossible to read. Some data may even be lost off the right edge of the screen.

In sharp contrast, the image on LCD display 22 is not distorted. Pixels on a flat-panel display are not written by an electron beam, but are written by applying voltages to x and y coordinates on a grid making up the display screen. Since the pixel position is determined by the physical grid, the image does not suffer from displacements.

However, some horizontal lines are brighter than other lines. The brightness of a pixel on a flat-panel display is determined by the amount of time that a voltage is applied. Since the clocks are modulated, some lines have longer periods than other lines. This causes some lines to momentarily appear brighter or dimmer than other adjacent lines.

After a period of time, the display is damaged. The display should be driven with A.C. voltages, with the amount of time a negative voltage is driven being equal to the amount of time that a positive voltage is driven. However, clock modulation allows some lines to remain in one polarity longer than in the other polarity. Over time, D.C. voltages build up for some lines and can damage the display grid.

What is desired is to apply spread-spectrum techniques and reduce EMI from a graphics subsystem. It is desired to modulate the graphics clock without distorting the image to a CRT. It is further desired to modulate a graphics clock in a portable computer to reduce radiation. Both the flat-panel and an external CRT monitor should be driven without distortions.

SUMMARY OF THE INVENTION

A graphics controller reduces electromagnetic interference (EMI). A pixel-transfer path has buffering means for buffering pixels from a video memory and pixel processing means for processing pixels. The pixel-transfer path has a pixel output. A flat-panel converter receives pixels from the pixel output of the pixel-transfer path. It converts pixels to a format for transfer to a flat-panel display. The flat-panel converter has a panel-interface output coupled to the flat-panel display.

Video clock means supplies a video clock for synchronizing the transfer of pixels. The video clock has a constant frequency. The video clock is coupled to the pixel-transfer path. A timing generator is coupled to receive the video clock. It generates horizontal and vertical timing signals for synchronizing display of horizontal lines of pixels. The horizontal and vertical timing signals are coupled to the flat-panel display.

Modulated video clock means supplies a frequency-modulated video clock to the flat-panel converter. The flat-panel converter transfers pixels out the panel-interface output to the flat-panel display at a modulated rate proportional to a current frequency of the frequency-modulated video clock. Thus pixels are transferred to the flat-panel display using the frequency-modulated video clock, reducing EMI, but the horizontal and vertical timing signals are generated by the video clock without modulation.

In further aspects of the invention a digital-to-analog converter (DAC) is coupled to receive pixels from the pixel output of the pixel-transfer path. The DAC converts pixels to analog voltages for driving a cathode-ray-tube (CRT) display. The DAC converts pixels to the analog voltages a constant rate proportional to the video clock. The CRT receives the horizontal and vertical timing signals from the timing generator. Thus pixels are transferred to the CRT at the constant rate while pixels are transferred to the flat-panel display at the modulated rate.

In further aspects the CRT is driven with pixels to display a same image as displayed on the flat-panel display. A FIFO is coupled between the pixel output and the flat-panel converter. It receives pixels from the pixel-transfer path in response to a pulse of the video clock, and it outputs pixels to the flat-panel converter in response to a pulse of the frequency-modulated video clock. Thus pixels synchronized to the video clock are buffered by the FIFO to by synchronized to the frequency-modulated video clock, the frequency-modulated video clock is asynchronous to the video clock.

In still further aspects the frequency-modulated video clock sweeps through frequencies less than and equal to the constant frequency of the video clock. Thus pixels are outputted from the FIFO more slowly than pixels are received into the FIFO.

In other aspects a clock modulator receives the video clock and modulates the constant frequency of the video clock to the current frequency to generate the frequency-modulated video clock. The frequency-modulated video clock is coupled to the modulated video clock means. Thus the frequency-modulated video clock is generated by modulating the current frequency of the video clock. The clock modulator sweeps the current frequency in small increments between a maximum frequency and a minimum frequency so that the current frequency is gradually changed.

DETAILED DESCRIPTION

Figure 1:
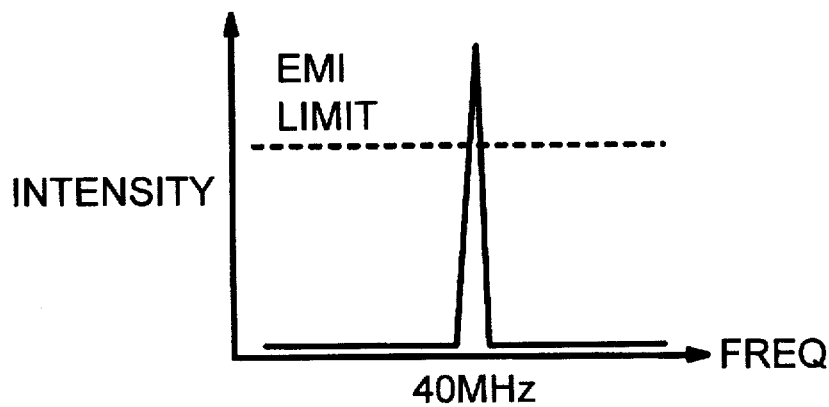
FIG. 1 shows a graph of radiation intensity as a function of frequency for an un-modulated clock signal.
Figure 2:
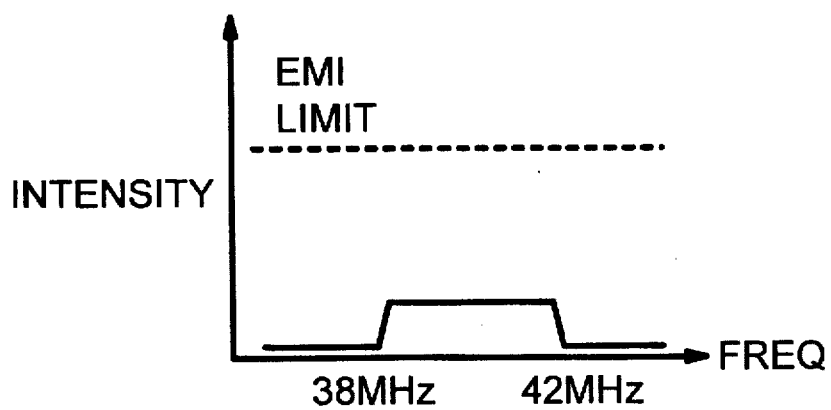
FIG. 2 is a graph of radiation intensity as a function of frequency generated by a modulated clock.
Figure 3:
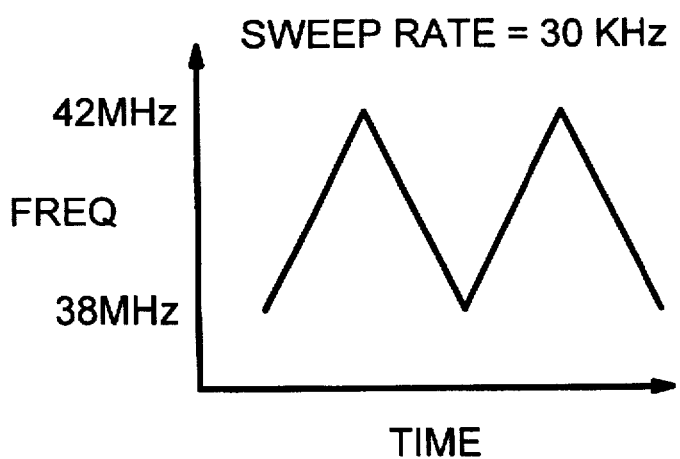
FIG. 3 is a graph of a modulated clock's frequency as a function of time over a few sweep periods.
Figure 4:
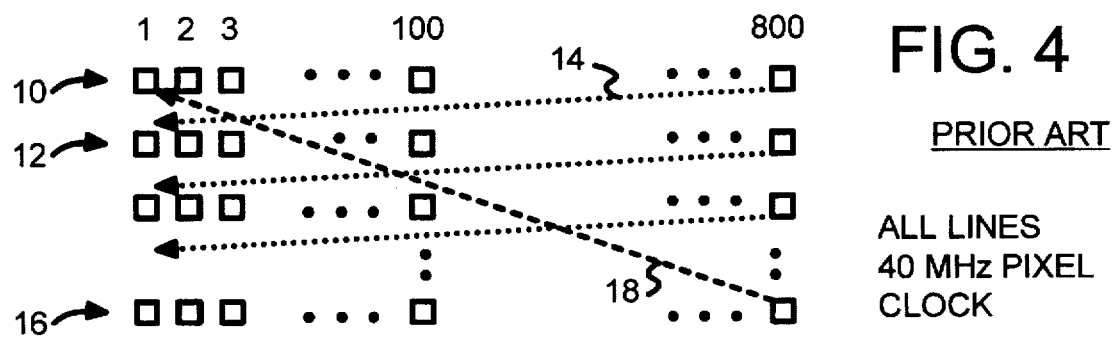
FIG. 4 is a diagram of a display, which could be a cathode-ray-tube (CRT) video display, or a flat-panel liquid-crystal display (LCD) or other type of display.
Figure 5:
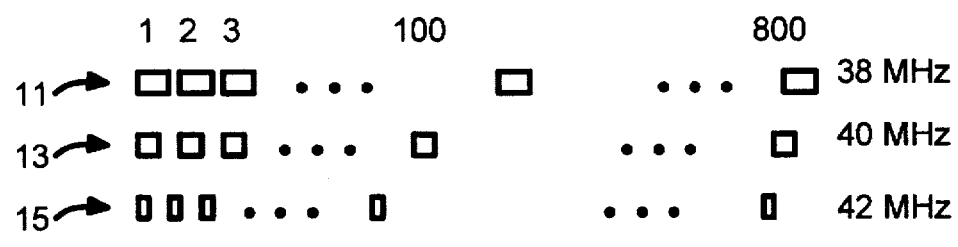
FIG. 5 shows a display using a modulated clock where different lines have pixels displaced relative to pixels in other lines.
Figure 6:
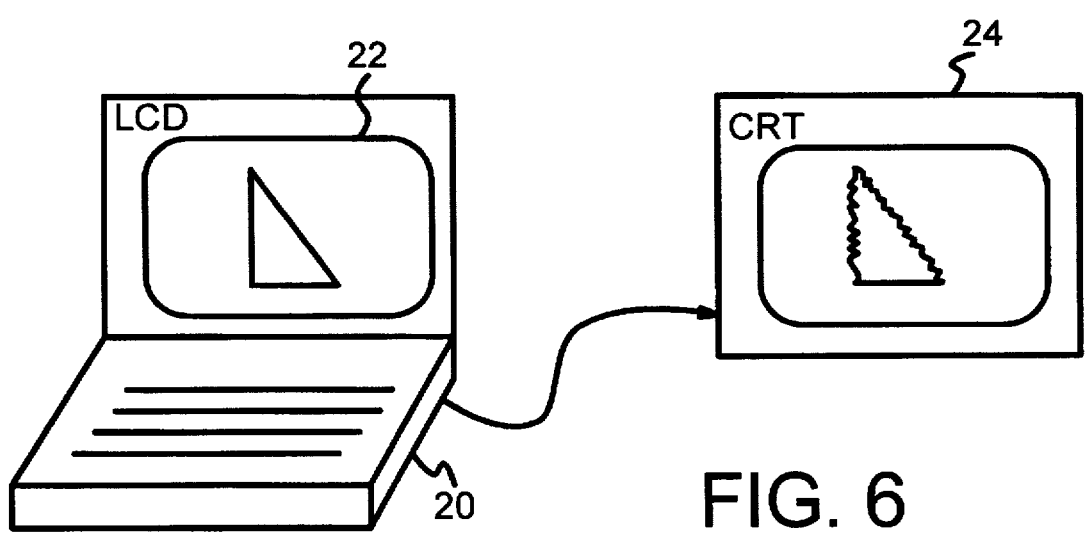
FIG. 6 shows a portable PC driving a flat panel and a CRT when the graphics clock is modulated.

The present invention relates to an improvement in EMI reduction in graphics subsystems. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

As discussed in the background section, modulation cannot simply be applied to the input clock of a graphics controller, since the CRT's image is distorted, while the LCD flat panel experiences brightened and dimmed horizontal lines, and possibly damage from D. C. voltage buildup.

Spread-Spectrum Applied to Flat-Panel Display, but not to CRT

The inventors have realized that the CRT typically uses a shielded cable which conducts low-voltage-swing analog signals. Thus the CRT is not a major EMI radiator. In contrast, the flat-panel interface, although being shorter in length, is a major EMI source since full-voltage-swing digital signals are used, often with parallel data signals. Shielding the flat-panel interface is costly, bulky, and thus undesirable. The inventors have therefore realized that spread-spectrum techniques can be beneficially applied to the flat-panel interface but not to the CRT interface.

Since graphics controllers are so complex, many different ways to integrate spread-spectrum into the controller are possible. Many configurations are even possible when the modulated clock is applied to the LCD path and not to the CRT path. A simple implementation is to apply the modulated clock to just the shift clock which shifts a group of pixels into a shift register in the flat panel. However, adding the spread spectrum at this point introduces extra delay. This extra delay can cause the data to not be latched into the panel's shift register with the required set-up time, requiring that an additional set of latches be added. Another problem occurs when the modulated clock causes the pixels to be written more slowly than nominal. Some pixels at the end of the horizontal line may be delayed so much that they are not latched into the shift register before the data in the shift register is transferred to the display grid. Thus some pixels at the end of the line may be lost.

The shift clock and the group of pixels outputted from the graphics controller can be buffered with a FIFO or other buffer at the output of the graphics controller. Unfortunately, power, cost, and board area occupied can increase. But the buffer could also be located at other points in the LCD datapath.

Rather than have two separate datapaths, one for the CRT and a second for the LCD panel, the CRT's datapath is shared with the LCD datapath. Most of the buffering, color mapping, and attributes added for the CRT path also needs to be performed for the LCD path. The CRT's datapath can be tapped off before conversion to analog voltages, and the pixels sent to an LCD controller for gray-scale conversion and other formatting needed for the panel interface. Thus the graphics controller has a partially combined or shared datapath.

Figure 7:
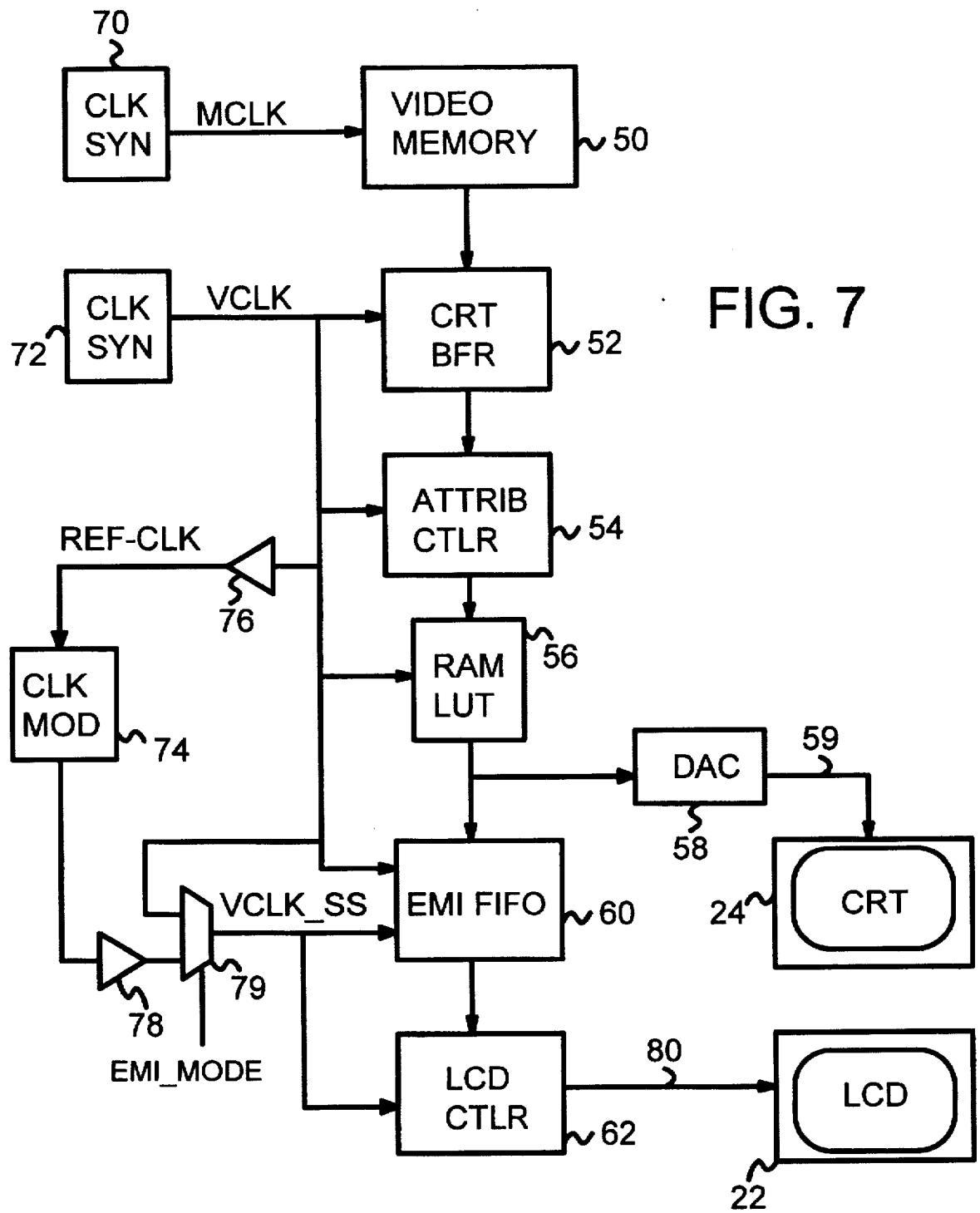
FIG. 7 is a diagram of a CRT and LCD graphics controller using a modulated clock for the LCD portion but not for the CRT portion to reduce EMI for the LCD panel interface.

FIG. 7 is a diagram of a CRT and LCD graphics controller using a modulated clock for the LCD portion but not for the CRT portion to reduce EMI for the LCD panel interface. A first clock synthesizer 70 is used to generate a memory clock MCLK, which is used to time and sequence accesses to video memory 50. Video memory 50 stores pixels for display on CRT 24 and LCD display 22. The image of the screen stored in graphics memory 50 can be stored either as raw pixels or as characters of text along with a character map for converting text to pixel bitmaps. New images are written by a host processor to video memory, perhaps through a FIFO or buffer (not shown) to synchronize data transferred using the host's clock to the memory clock.

As the screen is refreshed, requests for more pixels are generated to video memory 50, and pixels are copied from video memory 50 to CRT buffer 52 using the memory clock MCLK to write the pixels into CRT buffer 52. These pixels are read out of CRT buffer 52 by an asynchronous pixel or video clock VCLK. VCLK is generated by second clock synthesizer 72. Both first clock synthesizer 70, generating MCLK, and second clock synthesizer 72, generating VCLK, can be constructed from PLL's which receive a stable input clock, such as a graphics clock input to the controller chip. A standard 14.318 MHz clock is often used.

Pixels read from CRT buffer 52 are sent to attribute controller 54, which modifies pixels to add attributes such as blinking or reverse video. Pixels are then clocked to RAM look-up table 56, which contains a table in memory to re-map the color represented by a pixel. Thus a larger, richer color space can be used than is indicated by the raw number of bits in a pixel.

The re-mapped pixels from RAM look-up table 56 are transferred to digital-to-analog converter (DAC) 58. DAC 58 converts these pixels from digital values to analog voltages for red, green, and blue (RGB) sub-pixels. These analog voltages drive three signal lines in shielded cable 59 which connects the PC to external CRT 24. CRT 24 then converts these analog voltages to intensities of a red, green, and a blue electron beams which are focused on a point on the screen to display a pixel at the current scan location.

Pixels from RAM look-up table 56 are also sent to LCD display 22 through a second connection to EMI FIFO 60. EMI FIFO 60 receives pixels from RAM look-up table 56. These pixels are written to EMI FIFO using video clock VCLK. The pixels are temporarily stored in EMI FIFO 60 and read out to LCD controller 62 using a modulated video clock, VCLK_SS. LCD controller 62 performs formatting of pixels and gray-scale conversion so that the pixels are in a format accepted by LCD display 22. The formatted pixels are clocked out of LCD controller 62 and to LCD display 22 over panel interface 80.

Panel interface 80 thus is clocked by a modulated video clock VCLK_SS, or a derivative of this clock. A shift clock SCLK may be generated to shift several pixels over panel interface 80 in a single, slower clock cycle. Using a slower clock for the external interface allow a faster internal clock to be used where delays are smaller. The shift clock is simply a divided-down version of the modulated video clock VCLK_SS. Thus the shift clock is also modulated, reducing EMI radiation from panel interface 80.

Clock modulator 74 receives video clock VCLK and modulates the clock, producing VCLK_SS, the spread-spectrum video clock. The current embodiment uses an external clock modulator chip for clock modulator 74, so output buffer 76 and input buffer 78 are needed for buffering the video clock off the controller chip and receiving the modulated video clock as an input on the I/O pins of the controller chip. An external clock modulator chip is sold by International Microcircuits, Inc. of Milpitas, Calif. as the IMISM530 Reduced EMI Clock Modulator Chip.

Multiplexer 79 selects the modulated video clock from clock modulator 74 when the EMI-reduction mode is active, but the normal video clock VCLK is selected by multiplexer 79 as VCLK_SS when EMI mode is disabled. This allows the EMI modulation to be disabled. When EMI mode is disabled, video clock VCLK (or derivatives) clock LCD controller 62 as well as RAM look-up table 56, attribute controller 54, and CRT buffer 52.

Enabling EMI mode selects the modulated video clock, VCLK_SS, for LCD controller 62 and EMI FIFO 60. This uses modulated signals for panel interface 80, reducing EMI emissions.

Spread-spectrum clock modulation is thus applied only to the LCD flat-panel interface without modulating clocks in the CRT datapath. Thus no image distortion occurs on the CRT, while EMI emissions are reduced for the flat-panel interface. Since the clock modulation is applied after the internal PLL's, problems with loss of phase lock and jitter are eliminated.

EMI FIFO—FIG. 8

Figure 8:
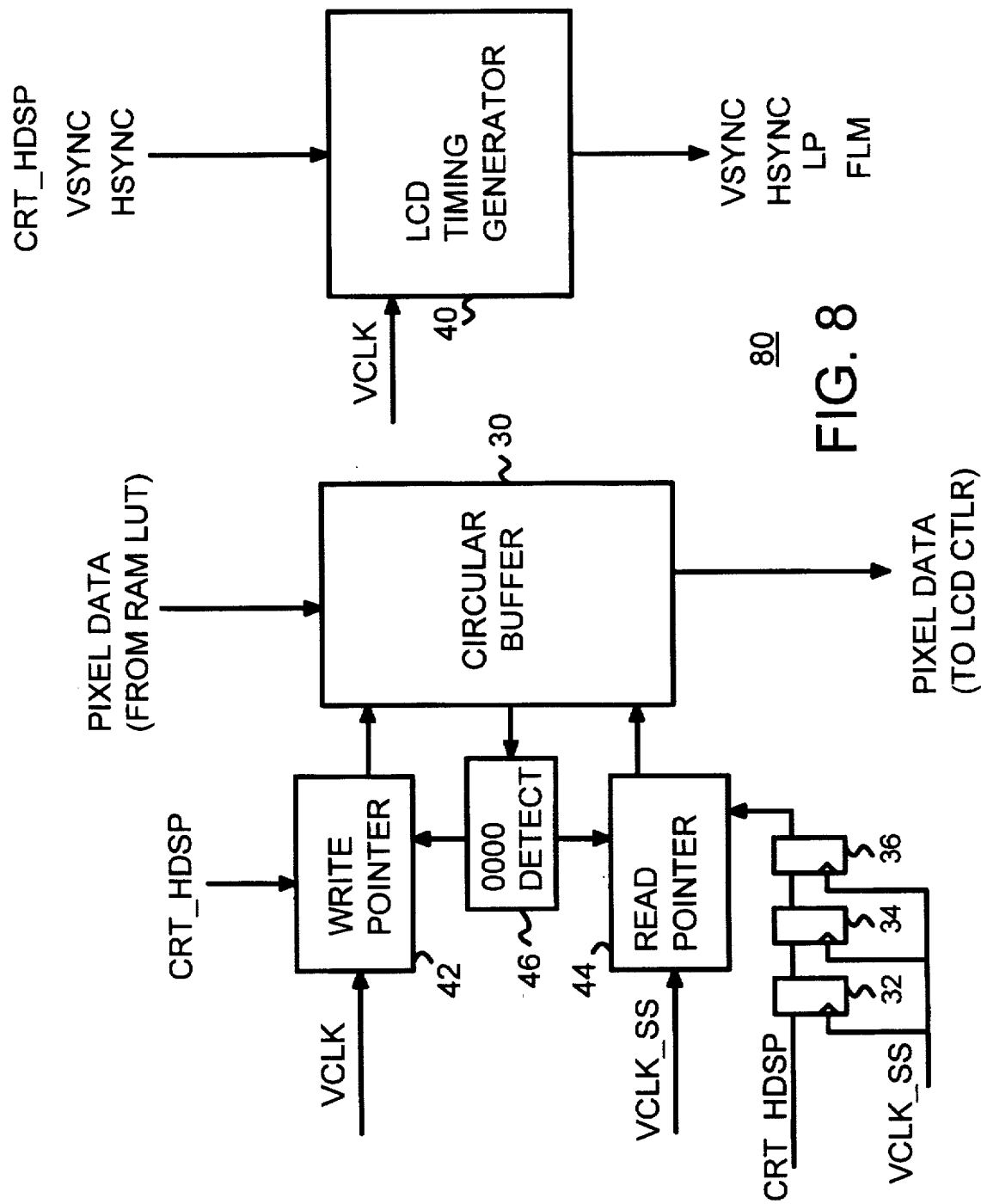
FIG. 8 is a diagram of a FIFO and timing logic added to the LCD datapath to buffer data for transfer over the panel interface using the modulated clock for EMI reduction.

FIG. 8 is a diagram of a FIFO and timing logic added to the LCD datapath to buffer data for transfer over the panel interface using the modulated clock for EMI reduction. EMI FIFO 60 contains circular buffer 30 which stores pixels received from RAM look-up table 56 for buffering to LCD controller 62 of FIG. 7. Write pointer 42 points to and enables a memory location in circular buffer 30 to receive the next pixel from RAM look-up table 56. Each pixel is written by a pulse of video clock VCLK, which is not modulated. Write pointer 42 increments with each pulse of VCLK when pixels are being transferred. Horizontal display signal CRT_HDSP is active when pixels are being transferred, but inactive during the horizontal blanking periods of the CRT when the electron beam is being re-traced to the beginning of the next horizontal line. Thus CRT_HDSP can be used to enable write pointer 42 at the beginning of a new horizontal line. Write pointer 42 loops back to zero after the maximum count is reached so that pixels are written to circular buffer 30 in a continuous loop.

Read pointer 44 points to and enables a next location for reading a pixel from circular buffer 30. Each pixel is read out of circular buffer 30 by a pulse of modulated video clock VCLK_SS, which increments read pointer 44. Upon reaching the terminal count, read pointer 44 also loops back to zero to continuously count in a loop.

Since the write and read clocks to the FIFO are asynchronous, due to the introduced modulation, the FIFO is a full dual-port FIFO. Reads and writes can be fully asynchronous to each other. A read can occur simultaneously with a write.

Since there is a slight delay before a pixel written to circular buffer 30 may be read out, the reading of the first pixel in a horizontal line must be delayed. Flip-flops 32, 34, 36 delay horizontal display signal CRT_HDSP by three periods of VCLK_SS before enabling read pointer 44. This delay is sufficient to allow the first pixel to be written to circular buffer 30 and ready for reading.

Disabling circular buffer 30 at the end of a horizontal line could be accomplished in a variety of ways. An end-of-horizontal line marker can be used. A pixel is encoded with a special pixel code which indicates the end of the horizontal line. For example, the code "0000" can be encoded into a pixel at the end of each horizontal line to signal that the line is over. This code also indicates that this pixel is not to be displayed. End detector 46 looks at pixels in circular buffer 30 and compares the code for these pixels to the special pixel code "0000". When a match is found with the pixel being written, end detector 46 disables and resets write pointer 42. When a match is found with the pixel being read, end detector 46 disables and resets read pointer 44. Thus end detector 46 can compare the pixels being read or written rather than all pixels in circular buffer 30. An alternative is to only compare the pixel being read, and then reset and disable both write pointer 42 and read pointer 44, discarding any extra pixels written after the end of the horizontal line. The FIFO is then reset at the end of every horizontal line, during the non-displaying period such as the horizontal blanking period.

A preferred method to detect the end of the horizontal line is to store a flag with the pixel data in the FIFO. The flag is set for pixels in the displayable portion of the line, but cleared for blanking periods. End detector 46 merely reads this flag from circular buffer 30 and disables the read and write pointers when a zero is detected. The flag is simply the CRT_HDSP signal which is set during the displayable portion of the horizontal line. The CRT_HDSP signal is written to circular buffer 30 as an extra bit of the pixel word. Other control signals can also be written to circular buffer 30 in parallel with each pixel and CRT_HDSP.

LCD Timing Signals Don't Use Modulated Clock

LCD timing generator 40 receives the CRT timing signals and generates timing signals for the LCD flat-panel display. The CRT's VSYNC, HSYNC, and CRT_HDSP signals mark the beginning of a new frame or screenfull of lines, the beginning of a new horizontal line of pixels, and when the pixels in a line are being displayed, respectively.

The timing of these signals need to be changed slightly, for instance by advancing the line-pulse (LP) start to meet front and back porch requirements for the panel. Additional signals are needed by the LCD display panel, such as a line-pulse (LP) signal and a first-line marker (FLM) signal. The line-pulse signal is a pulse during the horizontal blanking period at the end of a line which causes the panel to shift all of the pixels for the horizontal line just written from a shift register to the display grid. An entire line of pixels is first shifted into this shift register in the panel assembly and then the shift register dumps all of the pixels to the display grid. Thus instead of scanning individual pixels, the flat-panel display accumulates pixels for a line and then displays the whole line of pixels for the entire horizontal line period.

LCD timing generator 40 uses the un-modulated video clock VCLK to generate these signals. The modulated video clock is not used so that these critical timing signal are always constant and never varied due to clock modulation. Thus the horizontal period does not vary, even through the pixels in the horizontal line are transferred using a modulated clock. The shift register in the panel assembly effectively buffers the pixels transferred in using the modulated clock to the un-modulated horizontal timing signals.

Constant Horizontal Period Despite Modulated Pixel Transfer

Using the un-modulated clock to generate the horizontal timing signals for the flat panel eliminates the problem with brighter and dimmer horizontal lines which occurs then the horizontal signals are generated with a modulated clock, as described in the background section. Each horizontal line has the same display time, and each frame of lines also has the same display time. Thus the panel interface reduces EMI radiation from pixel transfer, while maintaining constant horizontal timing and eliminating dim and bright lines and D.C. buildup of charge caused by variations in how long each horizontal line is displayed.

Full and Empty Flags Not Needed

While full and empty flags could be used to prevent data over- and under-runs, the clock modulation can be set to a "down mode" to sweep through frequencies less than the frequency of the video clock. This guarantees that the modulated video clock VCLK_SS is always equal to or less than the frequency of video clock VCLK. Thus pixels are always read out of circular buffer 30 at a frequency equal to or less than the frequency that pixels are written into circular buffer 30. Using a slower frequency for reading ensures that circular buffer 30 never becomes empty while the horizontal line is being displayed. Thus an empty flag is not needed.

Circular buffer 30 can be designed to have a storage capacity, or depth, large enough for the largest horizontal line, when the modulated frequency is at its lowest value. Since modulation is typically only 2.5% of the frequency, the data-rate mismatch is small, less than 2.5% of the number of pixels in the horizontal line. For Super VGA, each horizontal line has 800 pixels. Five percent of the pixels is 20 pixels. Thus a relatively small circular buffer may be used.

The clock modulation can also be set to "up-down mode" where the clock modulates both above and below the nominal frequency. The reading of the FIFO is started later than when "down mode" is used and a larger FIFO used to compensate for the modulated clock sometimes being faster than the nominal clock.

LCD Pixels Delayed into Horizontal Blanking Period

Figure 9:
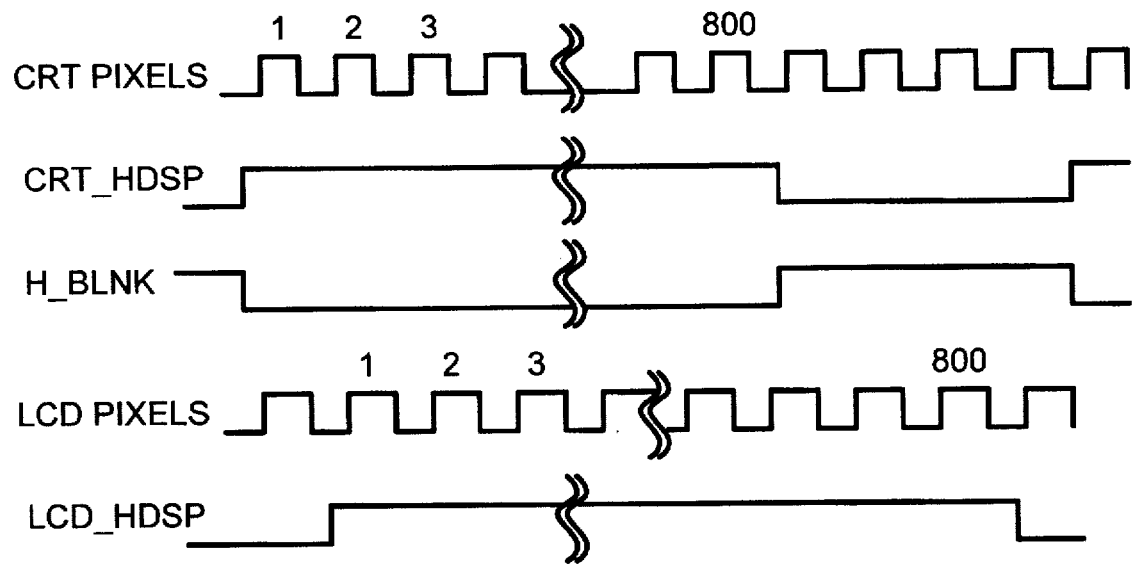
FIG. 9 is a timing diagram for a graphics controller driving a CRT with un-modulated signals but driving a LCD display with pixels using a modulated clock.

FIG. 9 is a timing diagram for a graphics controller driving a CRT with un-modulated signals but driving a LCD display with pixels using a modulated clock. CRT pixels are transferred to the CRT display over a shielded cable using an un-modulated video clock for timing. Each pixel has the same period. For Super-VGA mode, each horizontal line has 800 pixels. After all 800 pixels have been transferred to the CRT, the CRT horizontal display signal, CRT_HDSP, becomes inactive, signaling a horizontal blanking period H_BLNK when pixels are not displayed on the screen. The horizontal blanking period typically lasts for 15% to 30% of the horizontal period. The standard for SVGA is 240 blank pixels.

These CRT pixels are also copied to a LCD path just before being converted to analog voltages by the DAC. Pipeline delays including the delay through the EMI FIFO cause these pixels to be transferred to the LCD panel with a delay relative to the CRT pixels. The LCD pixels are transferred using a modulated clock which sweeps through frequencies less than the nominal pixel or video clock frequency used for CRT pixel transfer. As this frequency changes, the period of the pixels changes. The slower frequency of LCD pixel transfer results in the last LCD pixel being transferred to the LCD display several clock periods after the last CRT pixel was transferred.

If there was no horizontal blanking period, such as when a CRT is not simultaneously displaying the image on the LCD display, then delaying the last pixel could exceed the horizontal period, and the last few pixels would be lost or displayed on the next horizontal line. This loss of pixel data is not acceptable. Fortunately, a relatively large horizontal blanking period is required for a CRT to move its electron beam back to the beginning of a new line. Thus the horizontal blanking period provides ample time to delay the LCD pixels by using a slowed-down modulated video clock.

The LCD timing generator delays the LCD horizontal display signal until the last LCD pixel has been transferred. This can be accomplished by having end detector 46 send a signal to LCD timing generator 40 when the end-of-line code is detected, or by simply programming a larger value for the display time using a programmable register.

LCD panels do not require an extended blanking period, as do CRT's, but smaller front and back porch periods must be met. Large amounts of modulation could delay the last pixel on the horizontal line into the back porch, causing loss of data. Thus smaller amounts of modulation are desirable. 1% to 2.5% frequency modulation is appropriate.

SPREAD SPECTRUM EMI REDUCTION FOR CRT AND LCD

While today's CRT's have sufficient shielding in their cables to meet EMI requirements, as higher resolutions become standard in the future, faster clock speeds are required to transfer more pixels for each line. These higher clock speeds increase emissions, and thus spread-spectrum techniques are desirable for the CRT interface as well as the LCD panel interface.

The inventors have realized that the CRT's zig-zag and wiggle distortions are caused by two factors:

1. PLL's unable to track modulations in frequency
2. Different horizontal lines have varying pixel timings.

The problems in applying spread spectrum to a graphics controller are not caused by the fact that signals are modulated. Instead the problems arise from secondary effects caused by the modulated clocks, such as variable horizontal timings and interaction with PLL's.

The first factor, interaction with PLL's, can be eliminated by modulating a clock after the PLL, or by integrating the spread-spectrum function within the PLL. Any reference clocks which are input to a PLL should not be modulated, because PLL's require a stable clock.

The second factor is accounted for by ensuring that all horizontal lines have the same timing. Each horizontal line's period must be identical. The relative positions of pixels within each line must be the same as for other lines.

The previously-described embodiment met the first factor by modulating the video clock after it was generated by the PLL. The second factor was met by using the un-modulated video clock to generate the horizontal timing signals. The pixels were transferred to the LCD display using the modulated clock.

The inventors have realized that the second factor can be met even while modulating the video clock to the CRT. If the clock modulation can be synchronized with the horizontal timing, then the problems can be avoided. The frequency sweep for the modulated clock is re-started or reset as part of the horizontal timing of each line.

Figure 10:
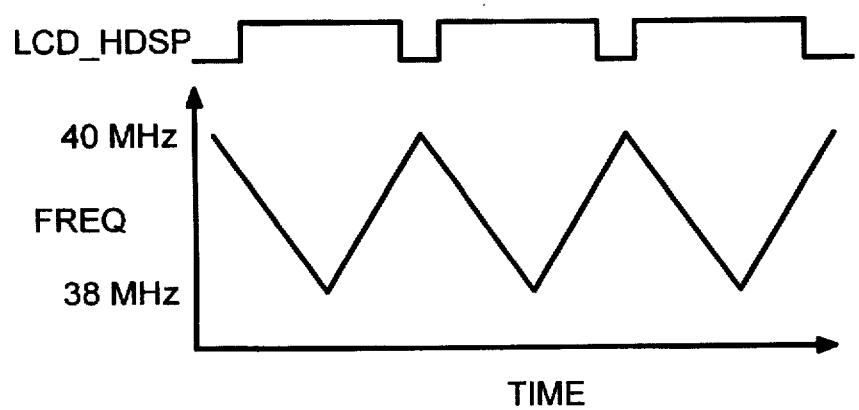
FIG. 10 is a graph of a modulated clock which has the frequency sweep reset during the horizontal blanking time for each horizontal line.

Sweep Reset By Horizontal Timing—FIG. 10

FIG. 10 is a graph of a modulated clock which resets the frequency sweep as part of the horizontal timing for each horizontal line. At the end of each horizontal line's display period, when the horizontal display HDSP signal goes low (inactive), the frequency sweep is reset. The cycle period of the frequency sweep is equal to the horizontal period. The frequency slowly decrements with each clock cycle or group of clock cycles from the maximum frequency to the minimum frequency. The minimum frequency is reached near the middle of each horizontal line. The sweep then reverses direction and slowly increases with each clock cycle or group of clock cycles from the minimum frequency to the maximum frequency for the second half of the horizontal line.

Since pixels are being transferred to the display as the frequency sweeps down, each pixel has a slightly longer period than the previous pixel. This causes the middle pixel on a line to be wider than the first or last pixels on the line. For a 5% frequency sweep, the middle pixel is 5% wider than the first pixel. This is a small amount of difference, and since the first pixel is not adjacent to the middle pixel, the difference is not noticeable to the viewer. Of course, larger amounts of frequency sweep produce greater differences.

While the prior-art clock modulator chip slowly changed the frequency up and down during the sweep without regard to the horizontal period, this embodiment resets the frequency sweep during each horizontal blanking period. The frequency slowly sweeps to lower frequencies in small decrements during the first half of the display portion of the horizontal line, and then slowly sweeps to higher frequencies in small increments during the second half of the display portion of the horizontal line. The full range of frequencies are swept through during each horizontal line period.

Counters and other logic using the modulated clock are not affected by the shorter clock period as the sweep is reset. Horizontal and vertical timing signals can still be derived from this clock as long as PLL's are not used. Clock dividers to generate horizontal and vertical synchronization and blanking signals can safely use the modulated clock, despite the small frequency changes.

The exact number and range of frequencies that the modulation sweeps through is not important as long as EMI is reduced and the emissions spread out over several frequencies. A 2.5% downward sweep from 40 MHz to 39 MHz rather than the 5% sweep described above may also be used. The drawback to limiting the sweep is that less EMI reduction occurs for shorter lines since the frequency sweeps through a smaller range of frequencies. The sweep rate, or decrement amount, could be changed using a programmable register if this was a concern.

Modulation Frequency Sweep Reset By End of Horizontal Line

Figure 11:
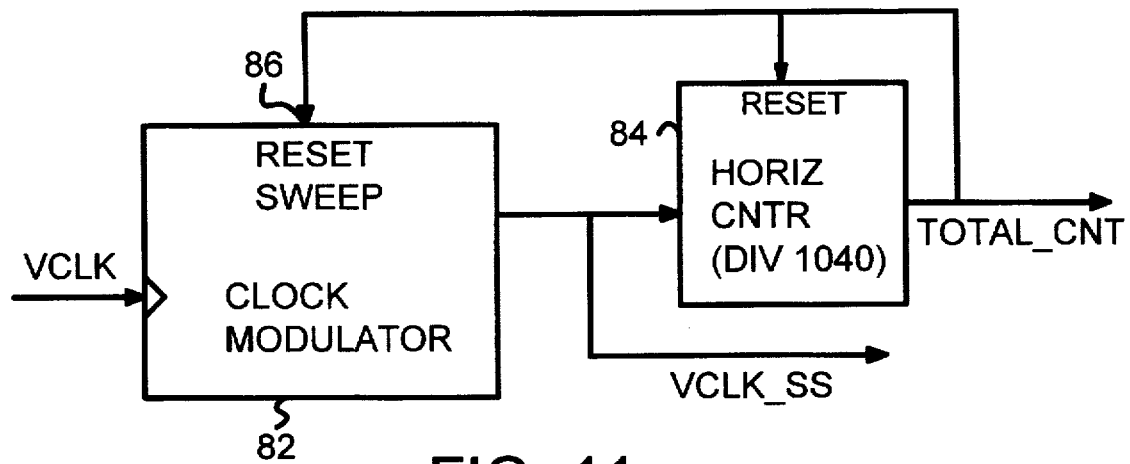
FIG. 11 is a diagram of a clock modulator which is reset by the end of the displayable portion of a horizontal line.

FIG. 11 is a diagram of a clock modulator which is reset by the end of the displayable portion of a horizontal line. Clock modulator 82 slowly decreases and then increases the frequency of a clock during a sweep period from a maximum frequency to a minimum frequency and back to the maximum frequency. Clock modulator 82 continues to decrease and then increase the clock's frequency until reset sweep input 86 is asserted. When reset sweep input 86 is asserted, a new frequency sweep cycle begins. The maximum frequency of the output clock VCLK_SS, is equal to the nominal frequency of video clock VCLK input to clock modulator 82.

The modulated video clock VCLK_SS output from clock modulator 82 is sent to control transfer of CRT and LCD pixels. Horizontal counter 84 also receives this modulated clock, which slowly decreases and then slowly increases in frequency as displayable pixels are transferred to the displays. Horizontal counter 84 is incremented for each pulse of the modulated video clock until the count reaches the total number of pixels in the line, including non-displayable pixels during retrace. The total number of pixels is 1040 pixels for SVGA, including 800 displayable pixels, or 800 pixels for VGA (including 640 displayable), or higher for higher resolutions. The total number varies with the retrace timing. Upon reaching the number of displayable pixels in the line, horizontal counter 84 pulses the horizontal display-enable signal HDSP inactive (high).

After the last displayable pixel has been transferred, horizontal counter 84 drives HDSP high, asserting the signal to sweep reset input 86. The sweep is reset, causing clock modulator 82 to begin a new frequency sweep, ready for the next horizontal line. This signal may be delayed for a few clock periods, or the resetting of the sweep may be delayed until later in the blanking period.

Figure 12:
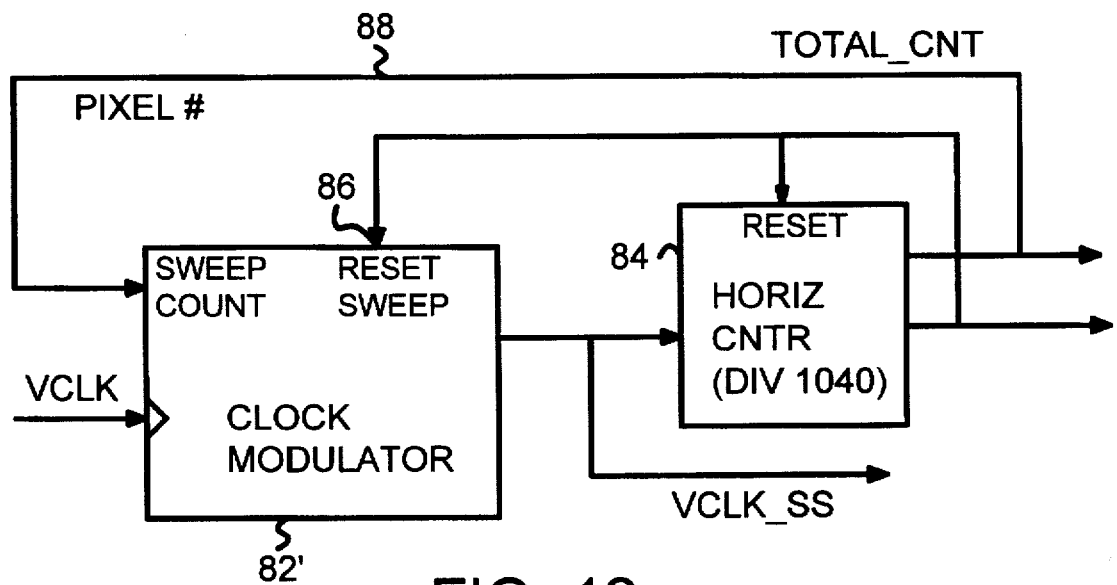
FIG. 12 shows a clock modulator which uses the horizontal counter as the frequency sweep counter.

The sweep decrement and increment may be generated by a sweep counter which slowly increments and decrements a clock divisor for a PLL in clock modulator 82 to generate the modulated frequency. Alternately horizontal counter 84 may be used as the sweep counter. FIG. 12 shows a clock modulator which uses the horizontal counter as the frequency sweep counter. The numerical count of horizontal counter 84 is also output to clock modulator 82'. The numerical output is the count value of horizontal counter 84, which is the pixel number of the current pixel. The pixel number increments from zero or one to the number of pixels in the line for the current resolution. This pixel number is also used to slowly increase the sweep divisor and is input as the sweep count input to clock modulator 82'. Once the middle count value is reached, the count is used to gradually decrease the sweep divisor and thus raise the frequency. Thus a separate sweep counter is not needed.

GRAPHICS CONTROLLER WITH RESETABLE FREQUENCY SWEEP

Figure 13:
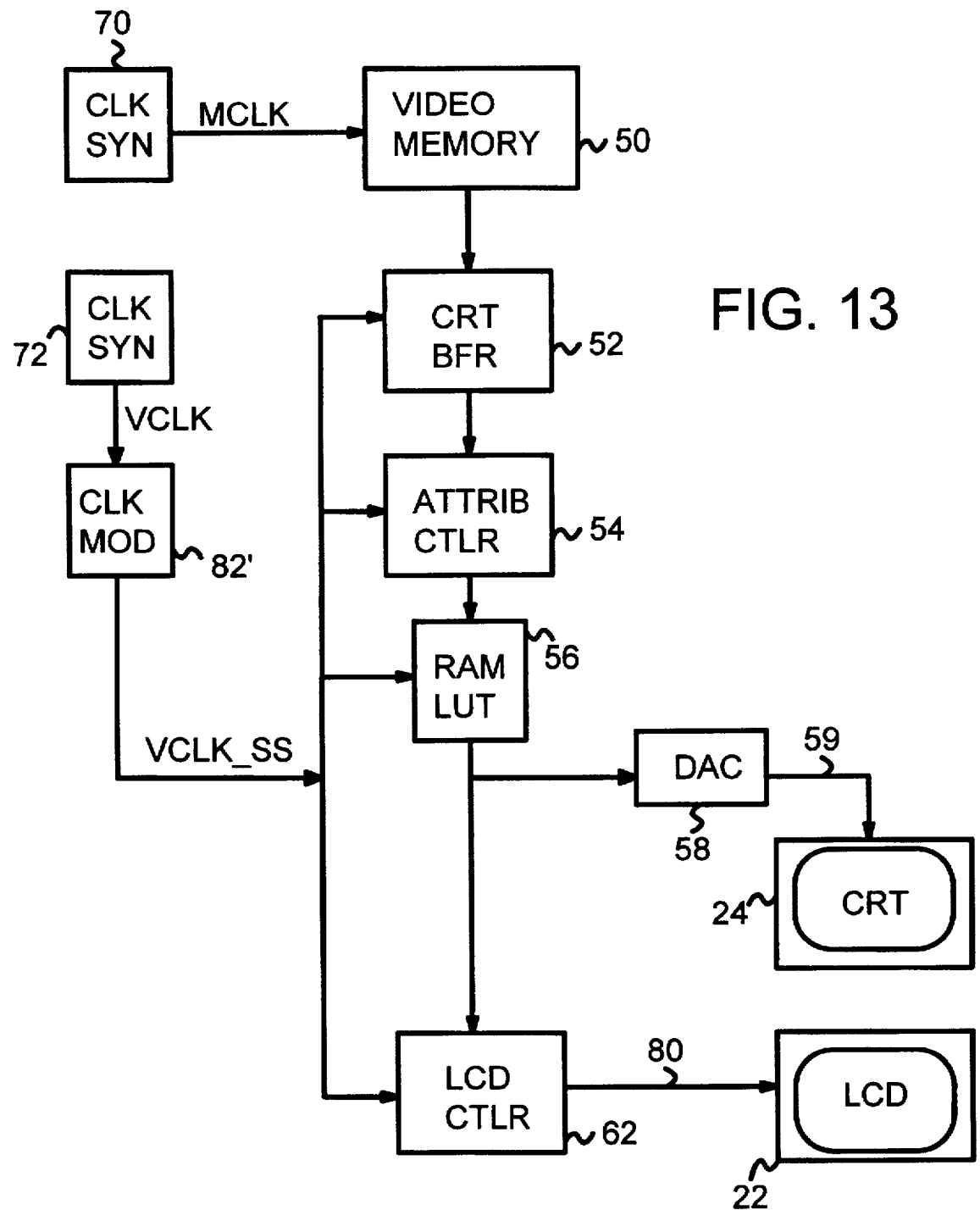
FIG. 13 is a diagram of an LCD & CRT graphics controller with clock modulation which is reset at the end of each horizontal line.

FIG. 13 is a diagram of an LCD & CRT graphics controller with clock modulation which is reset at the end of each horizontal line. Many blocks in FIG. 13 were already described in reference to FIG. 7.

Second clock synthesizer 72 generates an un-modulated video clock, which is immediately input to resetable clock modulator 82' to generate modulated video clock VCLK_SS. Resetable clock modulator 82' slowly decrements the frequency while pixels are being written to a first half of a horizontal line, but then slowly increments the frequency while pixels are being written to a second half of the horizontal line. The maximum frequency is reached at the end of a horizontal line during the horizontal blanking portion of the line.

The modulated video clock VCLK_SS is input to the entire CRT path and the LCD path, including CRT buffer 52, attribute controller 54, RAM look-up table 56, and LCD controller 62. Both shielded CRT cable 59 and panel interface 80 contain frequency-modulated signals, thus reducing the maximum intensity of EMI emissions for both the CRT and the panel interfaces.

The EMI FIFO of FIG. 7 is no longer needed since the CRT and LCD paths use the same modulated clock. The LCD no longer need separate timing signals from the CRT's timing since the LCD pixels are no longer delayed by modulation relative to the CRT pixels. LCD-specific signals such as the line pulse and first line marker still need to be generated.

Pixel Position Fixed Relative to Corresponding Pixels in Other Lines

The horizontal and vertical timings signals for both the CRT and the LCD are both generated from the modulated video clock. No variations occur in either the vertical or horizontal timing signals since the clock modulation are always reset at the end of every horizontal line. Thus while frequency variations occur during a line, variations never occur from one line to another line.

Figure 14:
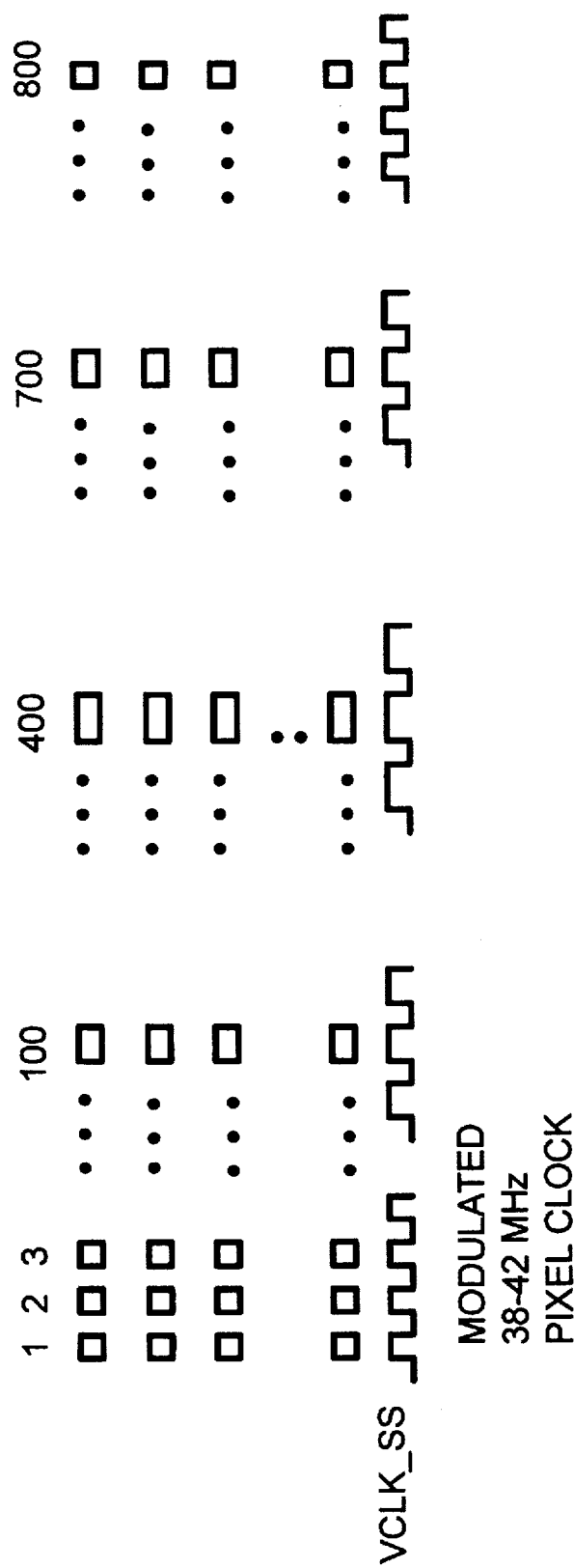
FIG. 14 shows that the VCLK period for successive pixels slowly increases as the frequency decreases as the line is written, but the same decrease occurs for each line.

Since the same frequency modulation occurs for every line, all corresponding pixels in different lines have the same timing. Thus the VCLK period which generates the one-hundredth pixel is always the same length of time, even for different lines. Even though the periods of different pixels on a line vary, the periods of corresponding pixels for different lines does not vary. FIG. 14 shows that the VCLK period for successive pixels slowly increases as the frequency decreases as the line is written up to the middle pixel, but the same decrease occurs for each line. Thus line-to-line timings are repeatable. A straight vertical line drawn by the pixels at position 100 appear as a straight line without zig-zags or wiggles, even though the clock is modulated as each line is written. Since the frequency slowly increase back to the maximum frequency during the second half of the line, the last pixel has about the same width as the first pixel, although the middle pixel is wider.

RESETABLE CLOCK GENERATOR

Figure 15:
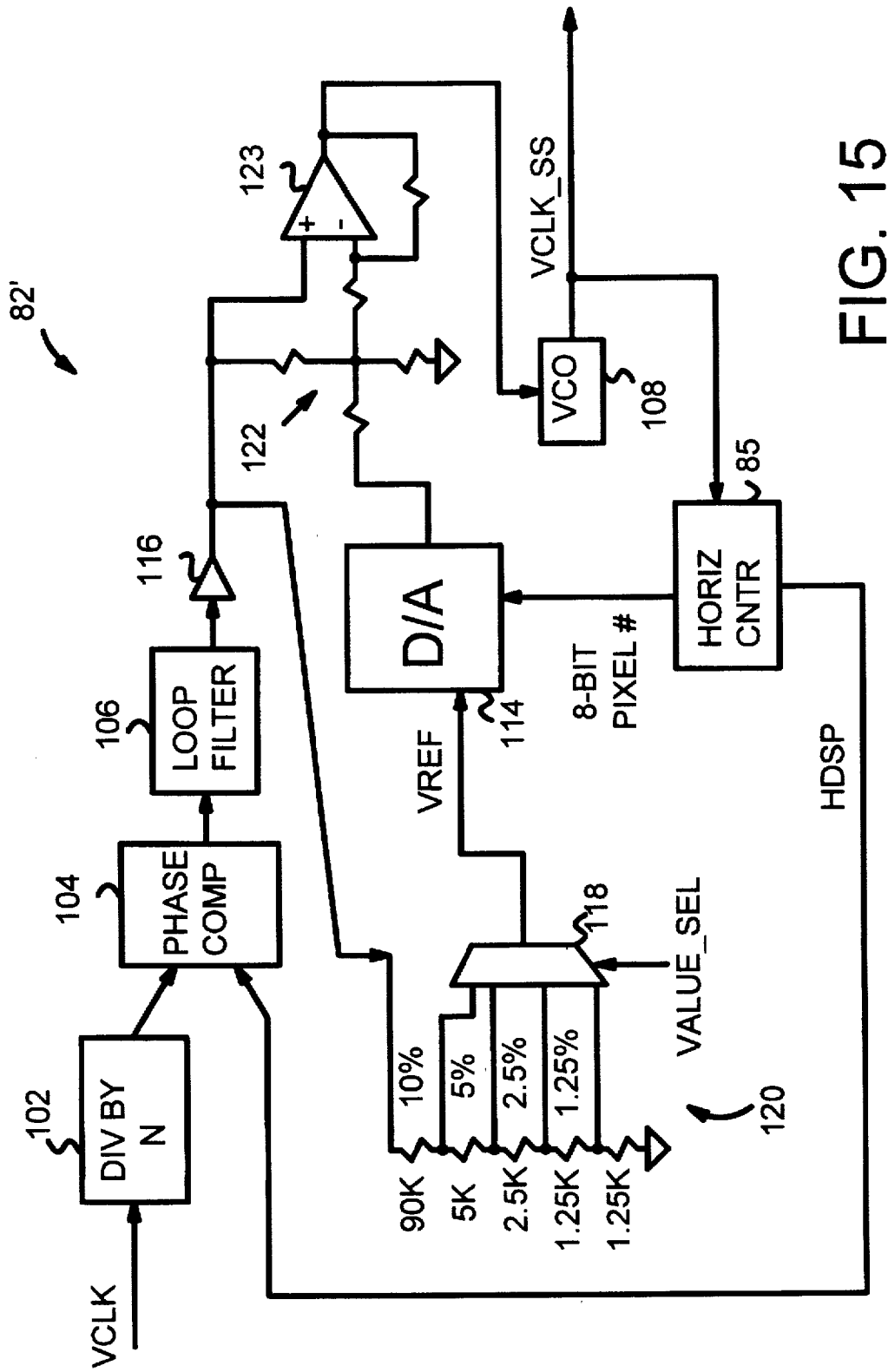
FIG. 15 is a diagram of a modulated clock generator 82' which uses the horizontal pixel counter to modulate the clock.

FIG. 15 is a diagram of a modulated clock generator 82' which uses the horizontal pixel counter to modulate the clock. The un-modulated video clock VCLK is input to counter 102, which divides VCLK by a numerator N, outputting a pulse to phase comparator 104 after every N cycles of VCLK. Phase comparator 104 outputs a voltage which is proportional to the difference in phase between its inputs. This voltage is filtered by loop filter 106, which is a simple R-C filter. The voltage from loop filter 106 is buffered by buffer 116, and modified by voltage divider 120. The modified voltage is input as the reference voltage to digital-to-analog (D/A) converter 114. This reference voltage modifies the analog voltage output from D/A converter 114. The analog voltage from D/A converter 114 is input to voltage summer 122 which sums the analog voltage from D/A converter 114 with the output voltage from loop filter 106. The summed voltage is applied to the inverting input of unity-gain inverting amplifier 123. The output from amplifier 123 is then input to voltage-controlled-oscillator (VCO) 108. VCO 108 generates the modulated video clock VCLK_SS. The frequency of the clock generated by VCO 108 is a function of the input voltage to VCO 108.

The modulated video clock, VCLK_SS, is used for all pixel-transfer functions, and for generating horizontal and vertical timing as described for FIG. 13. Horizontal up-down counter 85 receives this modulated video clock VCLK_SS, and counts the number of pixels which have been transferred for the current horizontal line. Horizontal up-down counter 85 divides the modulated video clock VCLK_SS by the total number of pixels in a line, including the non-displayable pixels during the blanking period. Thus for super-VGA, with 800 displayable pixels, the total pixels in each horizontal line is 1040. Horizontal up-down counter 85 first counts up to half the number of pixels in a horizontal line, then counts back down to the end of the line. Thus an up-down rather than an up-only counter is used. Other embodiments are also possible.

The pixel count output from horizontal up-down counter 85 is output as an 8-bit value which is the digital input to D/A converter 114. This 8-bit digital value is a binary number representing the clock modulation from the nominal frequency. For the first pixel, pixel 0, the pixel count from horizontal counter is 0, and the 8-bit value is 00 Hex. No modulation adjustment is made, and the frequency output is 40 MHz. Table 1 shows that as the pixels are transferred, the 8-bit value increases until the middle pixel, pixel 520. Then the 8-bit value decreases as the pixel count increases until the end of the horizontal line. The 8-bit value is converted by D/A converter 114 to an analog voltage which ultimately adjusts the frequency variation generated by VCO 108.

Horizontal up-down counter 85 can be programmed for different resolutions. Thus while table 1 shows SVGA resolution, with 1040 total pixels (800 displayable pixels), other resolutions are possible such as VGA resolution with 800 total pixels (640 displayable pixels). The middle pixel is actually the middle of the total pixels, rather than the displayable pixels.

TABLE 1

SVGA Sweep

| Pixel Count # | 8-bit D/D Output | Frequency |
|---|---|---|
| 0 | 00 | 40 MHz |
| 1 | 01 | 39.99 MHz |
| 130 | 4F | 39.5 MHz |
| 260 | 8F | 39 MHz |
| 520 | FF | 38 MHz |
| 780 | 8F | 39 MHz |
| 1038 | 01 | 39.99 MHz |
| 1039 | 00 | 40 MHz |

Horizontal up-down counter 85 can be used to convert pixel counts for different resolutions to a constant sequence of 8-bit values which control the frequency sweep. Horizontal up-down counter 85 can contain a programmable register with the middle pixel number. Another register is programmed with the step adjustment, which is the maximum 8-bit value of FF Hex, divided by half the number of pixels in a horizontal line for the current resolution. With each increase in pixel count, the 8-bit output is increased by the step adjustment for the first half of the line. A comparator signals when the middle pixel is reached, and the step adjustment is then subtracted with each new pixel count for the second half of the line.

Voltage divider 120 provides voltage steps which produce clock modulation from zero to 10%. Mux 118 applies the amount of modulation voltage to the VREF input of D/A converter 114. Voltage summer 122 sums the voltage from loop filter 106, and the desired amount of clock modulation selected by mux 118. The summed voltage is input to the inverting input of amplifier 123 which modifies the voltage applied to VCO 108. Thus when higher reference voltages are selected, greater voltage variations are produced as the pixel count increases, and thus more clock modulation is generated.

An alternative is to replace VCLK input to counter 102 with a reference clock such as the 14.318 MHz clock. A stand-alone clock generator for VCLK is then not needed as VCLK_SS is directly generated without the intermediate VCLK.

ADVANTAGES OF THE INVENTION

Spread spectrum techniques reduces the amplitude or intensity of EMI sufficiently that other EMI reduction techniques may be avoided. Adding filters, using metallic cases and shielded cables, and surrounding signals with ground planes and traces all add cost. This added cost can be avoided or reduced with the invention's spread spectrum technique.

Using the un-modulated clock to generate the horizontal timing signals for the flat panel eliminates the problem with brighter and dimmer horizontal lines which occurs then the horizontal signals are generated with a modulated clock, as described in the background section. Thus the panel interface reduces EMI radiation from pixel transfer, while maintaining constant horizontal timing and eliminating dim and bright lines and D.C. buildup of charge caused by variations in how long each horizontal line is displayed.

The EMI FIFO synchronizes the shift clock to the pixels transferred to the LCD flat panel display. Thus set-up time violations do not occur in the panel assembly for pixels written to the panel's shift register.

ALTERNATE EMBODIMENTS

Several other embodiments are contemplated by the inventors. For example other modes of the external clock modulator chip or the internal modulator could be used. Down mode, where the frequencies are swept from the nominal frequency to lower frequencies, was described. A center mode could be used by setting the nominal frequency to be below the nominal video clock frequency, but setting the maximum frequency to be the video clock's nominal frequency. An empty flag could be added to allow the frequency of the read clock to be greater than the nominal frequency of the video clock, rather than delay the FIFO read, or the start of the reading out of the FIFO may be delayed.

The resetable clock modulator is ideally integrated onto the same silicon die as the graphics controller, although other embodiments are possible. When integrating the modulator onto the same die as the graphics controller, the modulator must be protected or isolated from noise generated by the controller. Ground, power, and substrate isolation are useful.

While incrementing a counter for half the number of pixels in a horizontal line has been described, some designers prefer to decrement from half the number of pixels to zero. Decrementing is essentially incrementing by a negative increment rather than a positive increment. Thus incrementing with a negative value accomplishes the equivalent of decrementing.

The frequency sweep was described as being reset during the horizontal blanking period, but the sweep reset could occur at any time during the horizontal period, as long as the sweep is reset at the same point for each line. Thus the sweep could be reset at an arbitrary location, such as at pixel 219 of each line. The sweep could be reset more than once for each line, allowing the sweep to occur several times for each horizontal line. Each reset could simply reverse the direction of the frequency increments, such that the sweep is "reset" at the middle of the line as well as at the end of the line. Thus an even number of direction-reversing "resets" are needed.

The frequency sweep could even be rapidly reset during the blanking period. While the prior-art clock modulator chip slowly changed the frequency up or down during the sweep, this embodiment rapidly changes the frequency during the horizontal blanking period. The frequency slowly sweeps to lower frequencies in small decrements during the display portion of the horizontal line, but then quickly changes from the minimum frequency to the maximum frequency during the horizontal blanking portion. This rapid frequency change would be devastating to any PLL's receiving the modulated clock, and thus such an abrupt frequency change is a surprising departure from prior-art teachings on clock modulation.

Power-down modes are commonly used with flat-panel displays and the graphics adapter can be modified to enable the clock generation circuitry before power is restored to the display when resuming operation after a suspend mode. The sweep generator may require additional time to stabilize before operation can resume. The clocks can be powered-up in a sequence to allow PLL's to stabilize before the clock is used.

The inventors also contemplate having the type or make of panel assembly encoded into some of the signal lines in the panel interface. The graphics BIOS or boot code can read the encoding on these signal lines to determine which panel is connected to the graphics controller. Knowing the type of panel can allow the BIOS to decide how much EMI reduction can be applied for that particular panel.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A graphics controller for reducing electromagnetic interference (EMI) comprising:

a pixel-transfer path, including buffering means for buffering pixels from a video memory and pixel processing means for processing pixels, the pixel-transfer path having a pixel output;

a flat-panel converter, receiving pixels from the pixel output of the pixel-transfer path, for converting pixels to a format for transfer to a flat-panel display, the flat-panel converter having a panel-interface output coupled to the flat-panel display;

video clock means for supplying a video clock for synchronizing transfer of pixels, the video clock having a constant frequency, the video clock coupled to the pixel-transfer path;

a timing generator, coupled to receive the video clock, for generating horizontal and vertical timing signals for synchronizing display of horizontal lines of pixels, the horizontal and vertical timing signals coupled to the flat-panel display;

modulated video clock means for supplying a frequency-modulated video clock to the flat-panel converter, the flat-panel converter transferring pixels out the panel-interface output to the flat-panel display at a modulated rate proportional to a current frequency of the frequency-modulated video clock;

a digital-to-analog converter (DAC), coupled to receive pixels from the pixel output of the pixel-transfer path, for converting pixels to analog voltages for driving a cathode-ray-tube (CRT) display, the DAC converting pixels to the analog voltages a constant rate proportional to the video clock, and a FIFO, coupled between the pixel output and the flat-panel converter, for receiving pixels from the pixel-transfer path in response to a pulse of the video clock, and for outputting pixels to the flat-panel converter in response to a pulse of the frequency-modulated video clock, whereby pixels are transferred to the flat-panel display using the frequency-modulated video clock, reducing EMI, but the horizontal and vertical timing signals are generated by the video clock without modulation and whereby pixels are transferred to the CRT at the constant rate while pixels are transferred to the flat-panel display at the modulated rate and whereby pixels synchronized to the video clock are buffered by the FIFO to be synchronized to the frequency-modulated video clock, the frequency-modulated video clock being asynchronous to the video clock.

2. The graphics controller of claim 1 wherein the CRT is driven with pixels to display a same image being displayed on the flat-panel display.

3. The graphics controller of claim 1 wherein the frequency-modulated video clock sweeps through frequencies less than and equal to the constant frequency of the video clock, whereby pixels are outputted from the FIFO more slowly than pixels are received into the FIFO.

4. The graphics controller of claim 3 further comprising:

reset means for resetting the FIFO after a last displayable pixel is outputted in a horizontal line of pixels, whereby the FIFO is reset after each horizontal line of pixels.

5. The graphics controller of claim 1 further comprising:

a clock modulator, receiving the video clock, for modulating the constant frequency of the video clock to the current frequency to generate the frequency-modulated video clock; and coupling means for coupling the frequency-modulated video clock to the modulated video clock means, whereby the frequency-modulated video clock is generated by modulating the current frequency of the video clock.

6. The graphics controller of claim 5 wherein the clock modulator sweeps the current frequency in small increments between a maximum frequency and a minimum frequency, whereby the current frequency is gradually changed.

7. The graphics controller of claim 1 wherein the flat-panel display receives converted pixels from the panel-interface output of the flat-panel converter through a panel interface, the panel interface passing through a hinge connecting a base unit of a portable computer, the base unit having a keyboard, the hinge connecting the base unit to the flat-panel display, the hinge for closing the flat-panel display over the keyboard.

* * * * *